(12) United States Patent
Shigeta

(10) Patent No.: US 7,199,460 B2
(45) Date of Patent: Apr. 3, 2007

(54) SEMICONDUCTOR DEVICE AND METHOD OF MANUFACTURING THE SAME

(75) Inventor: Shinobu Shigeta, Tateyama (JP)

(73) Assignee: UMC Japan, Tateyama (JP)

( * ) Notice: Subject to any disclaimer, the term of this patent is extended or adjusted under 35 U.S.C. 154(b) by 41 days.

(21) Appl. No.: 10/397,278

(22) Filed: Mar. 27, 2003

(65) Prior Publication Data

US 2003/0183908 A1 Oct. 2, 2003

(30) Foreign Application Priority Data

Apr. 2, 2002 (JP) ............................. 2002-099785

(51) Int. Cl.
*H01L 23/48* (2006.01)
*H01L 23/52* (2006.01)

(52) U.S. Cl. ...................... 257/690; 257/784; 257/786

(58) Field of Classification Search ................ 257/690, 257/734, 779, 784, 786, 666; 438/612–613, 438/617

See application file for complete search history.

(56) References Cited

U.S. PATENT DOCUMENTS

| | | | | |
|---|---|---|---|---|
| 5,205,036 A | * | 4/1993 | Yamazaki | ..................... 29/856 |
| 5,444,303 A | * | 8/1995 | Greenwood et al. | ........ 257/786 |
| 5,691,568 A | * | 11/1997 | Chou et al. | .................. 257/691 |
| 6,344,696 B2 | * | 2/2002 | Nakamura et al. | .......... 257/786 |
| 6,501,169 B1 | * | 12/2002 | Aoki et al. | .................. 257/700 |
| 6,512,298 B2 | * | 1/2003 | Sahara et al. | ................ 257/773 |
| 6,670,700 B1 | * | 12/2003 | Hashimoto | ................... 257/686 |

* cited by examiner

*Primary Examiner*—Theresa T. Doan
(74) *Attorney, Agent, or Firm*—Crowell & Moring LLP

(57) ABSTRACT

A semiconductor device capable of reducing its size and increasing the number of chips on a wafer, and a method of manufacturing the same are provided. When manufacturing a semiconductor device, an uppermost layer as a dedicated layer for pads are formed above a layer in which power supply/ground wiring lines and wiring lines for supplying associated control signals to a memory cell unit and a control circuit are formed. The uppermost layer of the semiconductor device is comprised only of a plurality of pads 11 as an electrode for providing electrical connection with an external connection line for transmitting a signal to and from the semiconductor device, a plurality of contact holes 12 for providing electrical connection with lower wiring lines formed in a lower layer below the uppermost layer, and uppermost wiring lines 13 for connecting the plurality of pads 11 to the plurality of contact holes 12 correspondingly. In this case, the layout of the plurality of pads is made common regardless of the type of product.

16 Claims, 5 Drawing Sheets (a)

■ LOCATION AT WHICH WIRING LINE IN UPPERMOST LAYER IS CONNECTED TO WIRING LINE IN LOWER LAYER (b)

■ LOCATION AT WHICH WIRING LINE IN LOWER LAYER IS CONNECTED TO WIRING LINE IN UPPERMOST LAYER (a)

■ LOCATION AT WHICH WIRING LINE IN UPPERMOST LAYER
  IS CONNECTED TO WIRING LINE IN LOWER LAYER (b)

■ LOCATION AT WHICH WIRING LINE IN LOWER LAYER
  IS CONNECTED TO WIRING LINE IN UPPERMOST LAYER (a)

(b)

(c)

PRIOR ART

SEMICONDUCTOR DEVICE AND METHOD OF MANUFACTURING THE SAME

BACKGROUND OF THE INVENTION

1. Field of the Invention

The present invention relates to a semiconductor device such as a large scale integrated circuit (LSI) and a method of manufacturing the same.

2. Description of the Prior Art

Conventionally, a semiconductor device includes a plurality of pads as an electrode and the pads are formed together with power supply/ground wiring lines and wiring lines for supplying associated control signals to a memory cell unit and a control circuit in the same metal wiring layer. The memory cell unit and the control circuit are formed in the center of the semiconductor device and on the other hand, the pads are formed at the periphery thereof. Those pads are made in contact with, for example, the ends of probe tips on a probe card when a wafer-probe test is performed. This enables the semiconductor device to be connected to a test circuit and then, the electrical characteristics of the semiconductor device are measured to inspect the device. Furthermore, the pads thus configured physically and electrically are connected to, for example, lead terminals of a lead frame via bonding wires in the assembly process of the semiconductor device.

Recently, as a semiconductor device has been fabricated at high integration density, miniaturization of elements of a semiconductor device has been enhanced. However, the relevant techniques associated with probe tips on a probe card or wire bonding cause a limitation in the actions to enhance the miniaturization, making it difficult to reduce the area of a pad itself. In more detail, even when elements of a semiconductor device are formed small in size and fabricated in high density to reduce the area of individual elements, ratio of the area occupied by pads to the area of the semiconductor device tends to increase. For this reason, allocating space for a plurality of pads formed in the same metal wiring layer as that provided for power supply/ground wiring lines and wiring lines for supplying associated signals to a memory cell unit and a control circuit contributes to one of primary causes to prevent reduction of dimensions of an entire semiconductor device. Accordingly, it has been found as a problem associated with the conventional techniques that the number of chips on a wafer cannot be made to largely increase.

In addition, the number of types of semiconductor device tends to increase in response to diversification in the applications where semiconductor devices are employed. This results in a wider variety of pad layouts. For this reason, there arises the need to newly prepare a probe card and then modify a specification for designing a lead frame so as to correspond to each of various layouts of pads. This increases the cost of, for example, manufacturing a probe card and designing a lead frame, resulting in current increase in cost of manufacturing a semiconductor device.

The present invention has been conceived in consideration of the above-described problems and is directed to a semiconductor device capable of reducing its size and increasing the number of chips on a wafer, and further a method of manufacturing the same.

SUMMARY OF THE INVENTION

To accomplish the above object, according to the first present invention, there is provided a semiconductor device comprising an uppermost layer comprised only of: a plurality of pads as an electrode for providing electrical connection with an external connection line for transmitting a signal to and from said semiconductor device; a plurality of contact holes for providing electrical connection with lower wiring lines formed in a lower layer below said uppermost layer; and uppermost wiring lines for connecting said plurality of pads to said plurality of contact holes correspondingly.

To accomplish the above object, according to the second present invention, in the semiconductor device according to the first present invention, a layout of said plurality of pads is made common regardless of a type of product.

To accomplish the above object, according to the third present invention, there is provided a method of manufacturing a semiconductor device, comprising the steps of: forming a plurality of pads as an electrode for providing electrical connection with an external connection line for transmitting a signal to and from said semiconductor device; forming a plurality of contact holes for providing electrical connection with lower wiring lines formed in a lower layer below said plurality of pads; and forming uppermost wiring lines for connecting said plurality of pads to said plurality of contact holes correspondingly, said semiconductor device being further constructed such that an uppermost layer of said semiconductor device is comprised only of said plurality of pads, said plurality of contact holes and said uppermost wiring lines.

To accomplish the above object, according to the fourth present invention, in the method of manufacturing a semiconductor device according to the third present invention, a layout of said plurality of pads is made common regardless of a type of product.

DETAILED DESCRIPTION OF THE PREFERRED EMBODIMENTS

Figure 1:
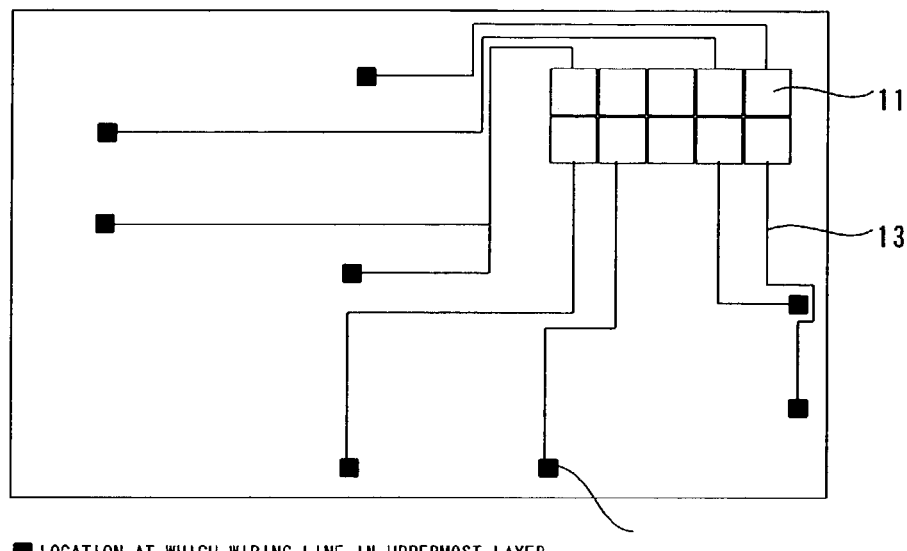
FIGS. 1(a) and 1(b) are diagrams shown to explain a semiconductor device A constructed in accordance with an embodiment of the present invention.
Figure 1:
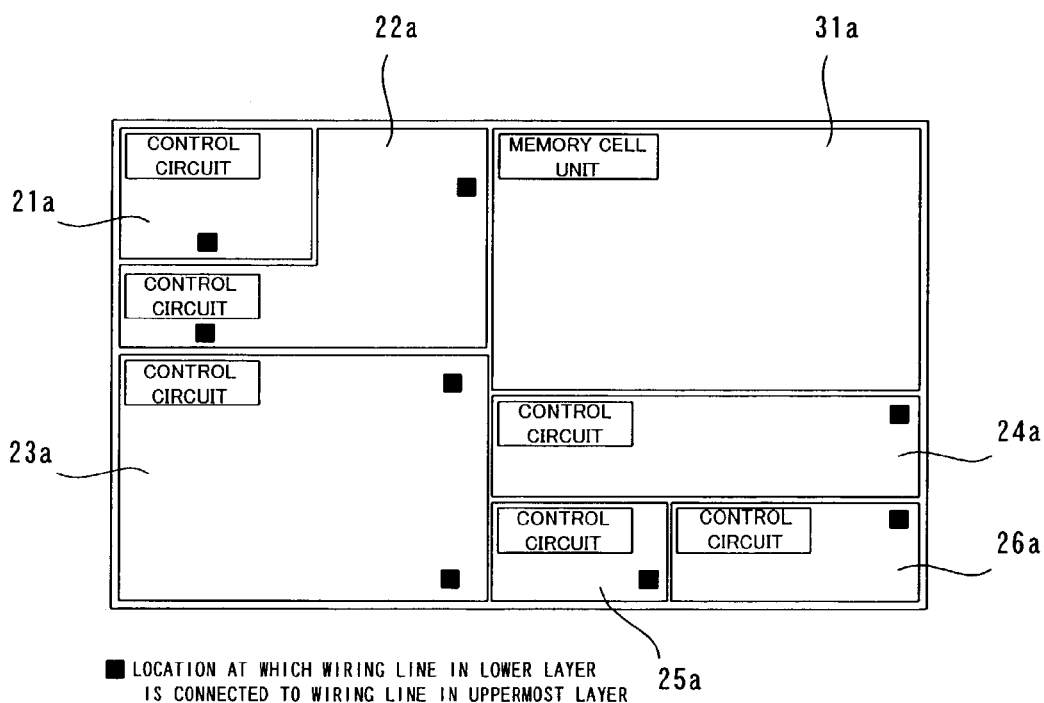
Figure 2:
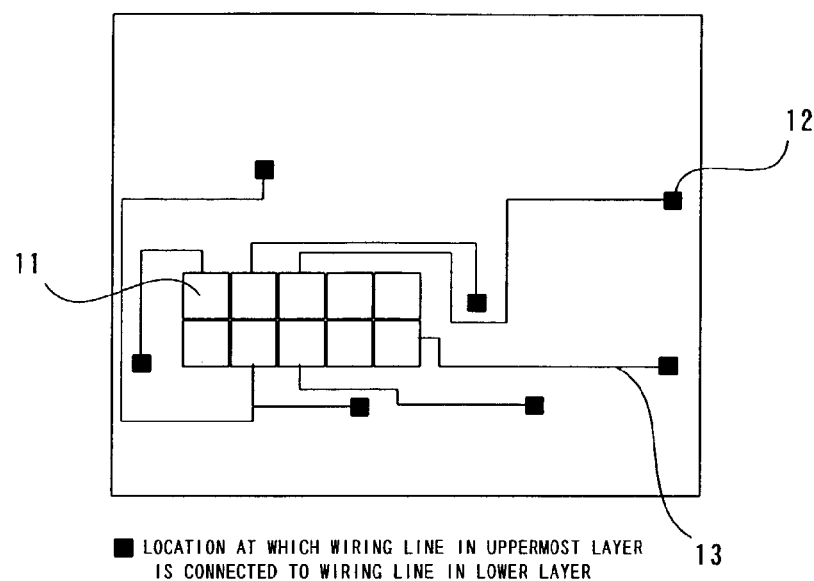
FIGS. 2(a) and 2(b) are diagrams shown to explain a semiconductor device B constructed in accordance with an embodiment of the present invention.
Figure 2:
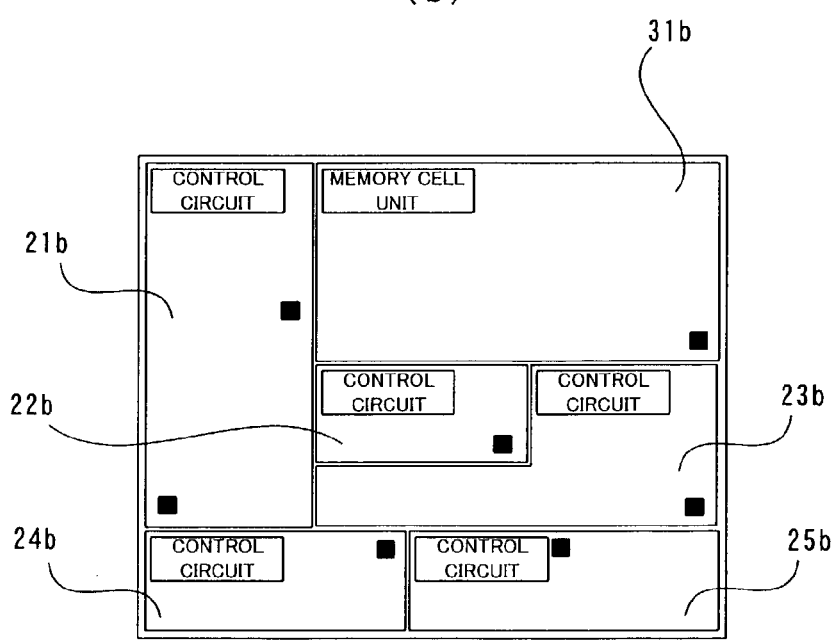
Figure 3:
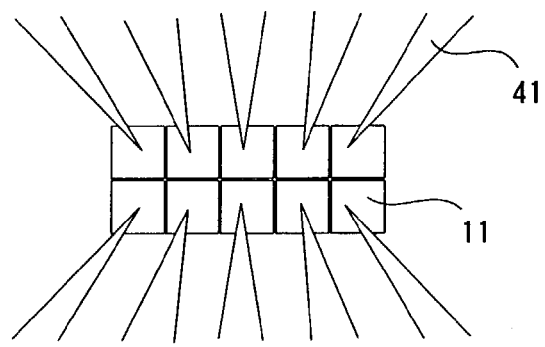
FIGS. 3(a)–3(c) are diagrams illustrating how electrical characteristics of the semiconductor devices A, B are measured to inspect those semiconductor devices and wire bonding is performed.
Figure 3:
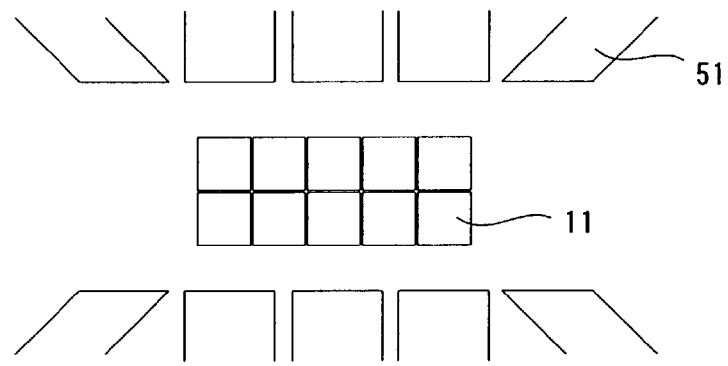
Figure 3:
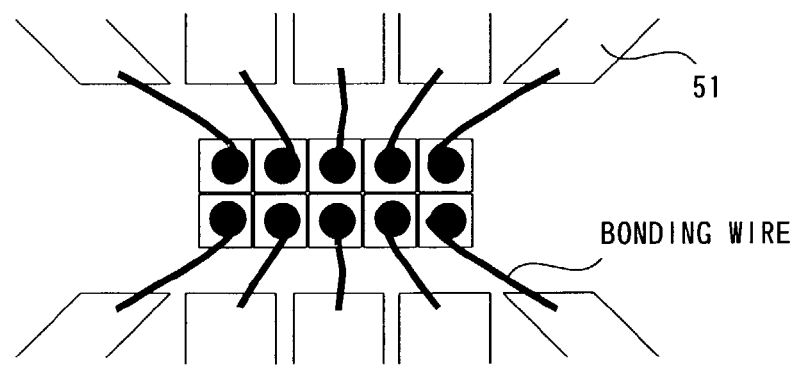

An embodiment of the present invention will be explained below with reference to the accompanying drawings. FIG. 1 is a diagram shown to explain a semiconductor device A constructed in accordance with the embodiment of the present invention and FIG. 2 is a diagram shown to explain a semiconductor device B constructed in accordance with another embodiment of the present invention and further, FIG. 3 is a diagram illustrating how electrical characteristics of the semiconductor devices A, B are measured to inspect those semiconductor devices and wire bonding is performed. Note that FIG. 1A is a general plan view of an uppermost layer of the semiconductor device A and FIG. 1B is a general plan view of a lower layer of the semiconductor device A.

Furthermore, FIG. 2A is a general plan view of an uppermost layer of the semiconductor device B and FIG. 2B is a general plan view of a lower layer of the semiconductor device B.

As shown respectively in FIGS. 1A and 2A, the semiconductor devices (IC chips) A, B constructed in accordance with the embodiment of the present invention each have an uppermost layer therein comprised only of a plurality of pads 11, a plurality of contact holes 12 and a plurality of uppermost wiring lines 13. The semiconductor devices A, B are products of different types and different in size, function and the like.

Each of the pads 11 is an electrode for providing electrical connection with an external connection line for transmitting a signal to and from the semiconductor device. In the embodiment, assume that a lead terminal of a lead frame is used as the external connection line and each of the pads 11 is connected to each of lead terminals of a lead frame via a bonding wire. Furthermore, the pad 11 constructed as described above is also used as an electrode configured to physically contact the end of a probe tip of a probe card when measuring the electrical characteristics of the associated semiconductor device to inspect the device. In this case, the term "probe card" means a card configured to have a plurality of probe tips thereon arranged to correspond to the location of the pads and to provide electrical connection between the pads of the semiconductor device and a specific test circuit. Note that the dimensions of the pad 11 are typically of the order of 80 micrometers square.

Furthermore, in the semiconductor devices A, B, the layout of the plurality of pads 11 is made common regardless of the type of product. That is, the layout of the pads 11 is standardized. Although the semiconductor B shown in FIG. 2 is different from the semiconductor A shown in FIG. 1 in size, function and the like, those two semiconductor devices have the same layout of the plurality of pads 11 formed in an uppermost layer of the device. Note that although those two semiconductor devices have the same layout of the plurality of pads 11, the location of the pads 11 need not necessarily be the same. As shown in FIG. 1A, in the case of the semiconductor device A, the plurality of pads 11 are disposed at an upper right portion of the device and in the case of the semiconductor device B, the plurality of pads 11 are disposed slightly apart from the center of the device in the left direction.

Each of the contact holes 12 indicated by a black square shown in FIGS. 1A, 2A is a hole for providing electrical connection with a lower wiring line formed in a lower layer below the uppermost layer. Each of the uppermost wiring lines 13 is a wiring line for connecting each of the pads 11 to the corresponding contact hole 12. Note that the standardized layout of pads probably causes some of the pads 11 not to be used in a semiconductor device depending on the type of product. In this case, the not-used pads should not be connected to the contact holes.

In the lower layer located below such uppermost layer, power supply/ground wiring lines and wiring lines for supplying associated control signals to a memory cell unit, a control circuit and the like are formed. FIGS. 1B, 2B each illustrate the layout of function blocks of the memory cell unit and the control circuit formed in the lower layer of each of the semiconductor devices A, B. As shown in FIG. 1B, the semiconductor device A has six control circuits $21a$, $22a$, . . . , $26a$ and a memory cell unit $31a$ formed therein. As shown in FIG. 2B, the semiconductor device B has five control circuits $21b$, $22b$, . . . , $25b$ and a memory cell unit $31b$ formed therein. The region indicated as a function block has a plurality of elements formed therein to achieve the corresponding function and a plurality of wiring layers are formed above those elements.

Furthermore, the black square shown respectively in FIGS. 1B, 2B indicates the location at which the lower wiring line in the lower layer is connected to the corresponding uppermost wiring line in the uppermost layer via the contact hole 12. Accordingly, the locations indicated by black squares shown in FIG. 1B correspond to the locations indicated by black squares shown in FIG. 1A, and the locations indicated by black squares shown in FIG. 2B correspond to the locations indicated by black squares shown in FIG. 2A.

Figure 4:
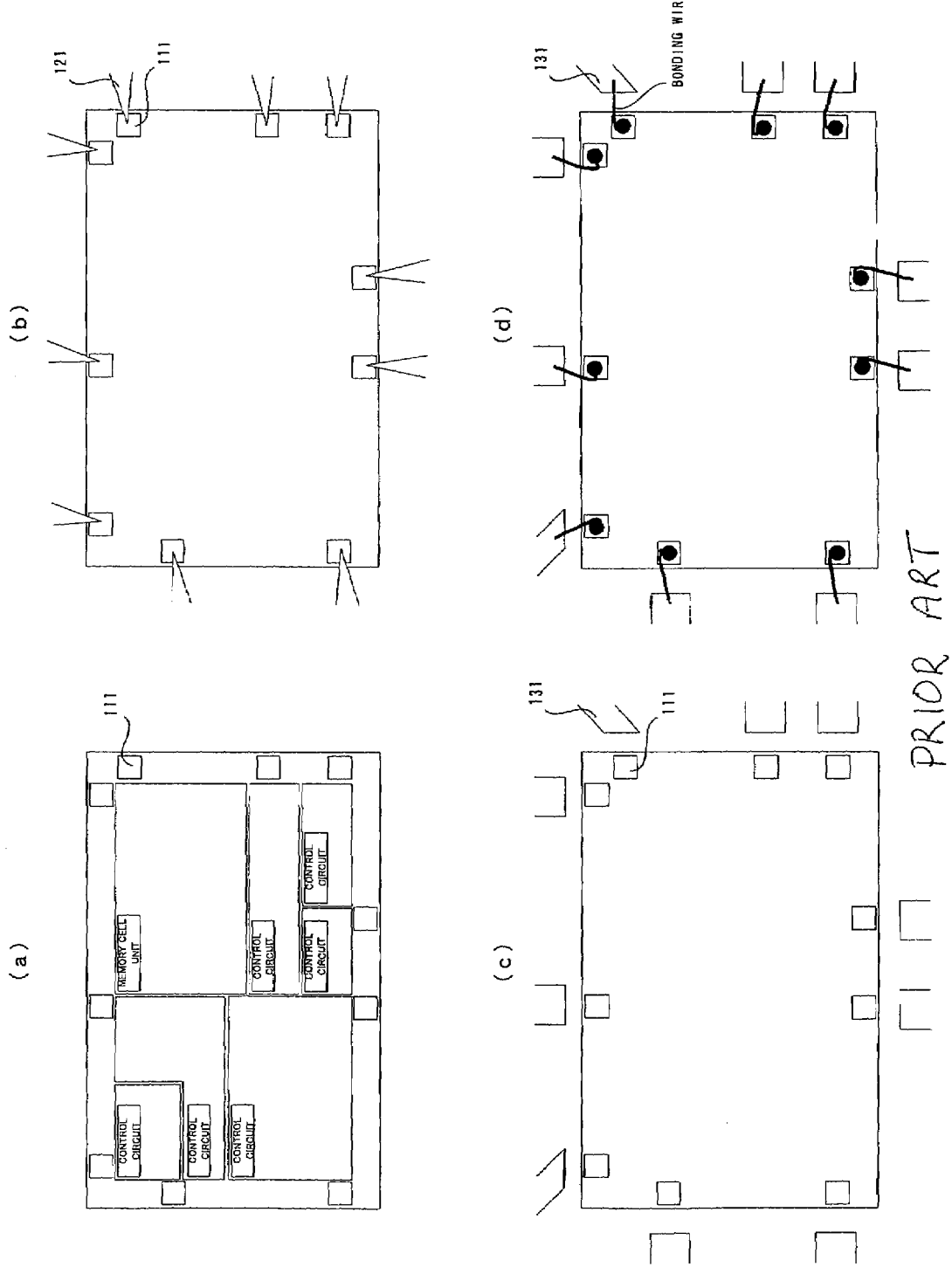
FIGS. 4(a)–4(d) are diagrams to explain a conventional semiconductor device A'.
Figure 5:
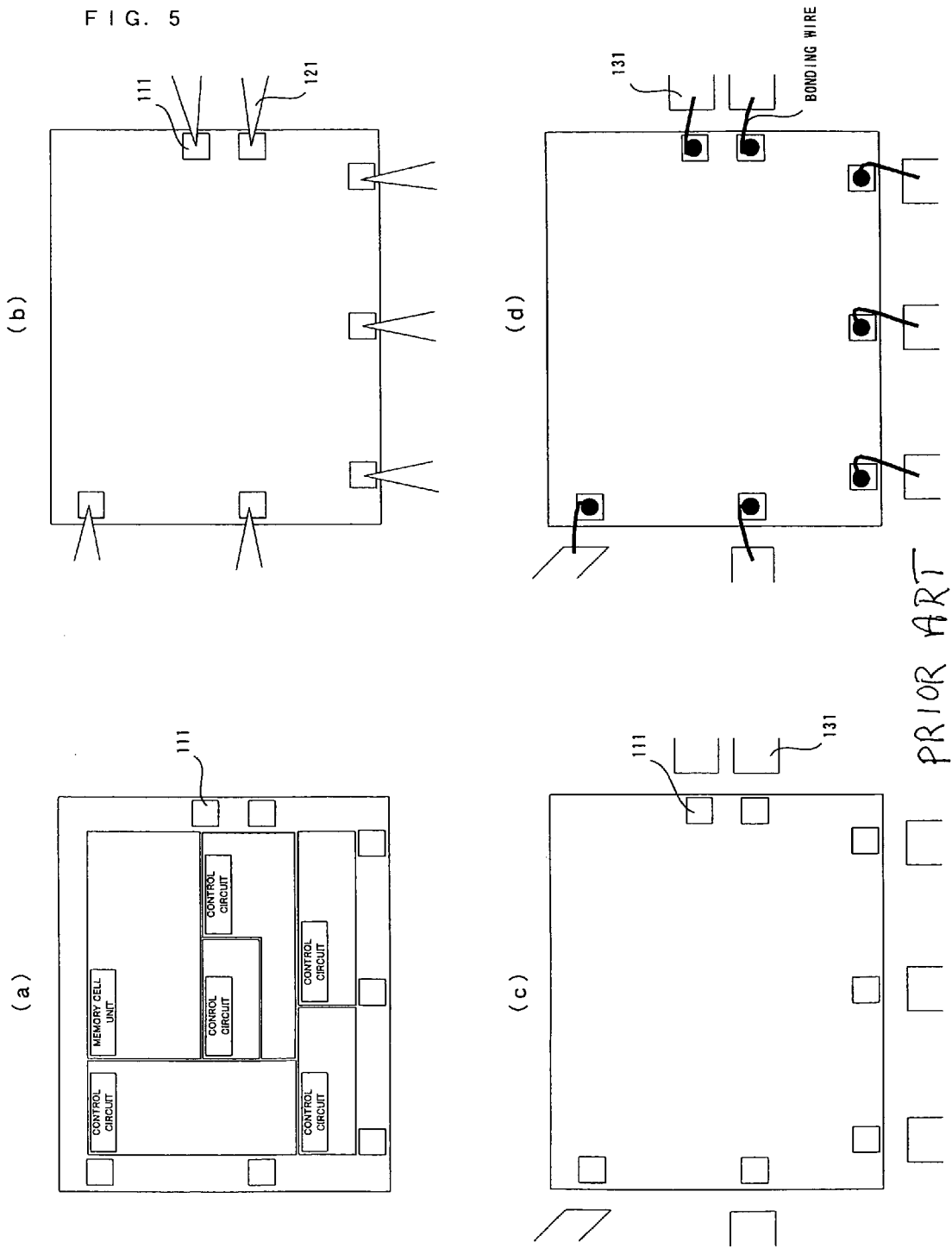
FIGS. 5(a)–5(d) are diagrams to explain a conventional semiconductor device B'.

Subsequently, assume that the same function blocks as those formed in the semiconductor devices A, B shown respectively in FIGS. 1, 2 are formed by a conventional technique. FIG. 4 is a diagram to explain a conventional semiconductor device A' corresponding to the semiconductor A and FIG. 5 is a diagram to explain a conventional semiconductor device B' corresponding to the semiconductor B. Note that FIG. 4A is a general plan view of an uppermost layer of the conventional semiconductor device A' and FIG. 5A is a general plan view of an uppermost layer of the conventional semiconductor device B'.

Conventionally, in the uppermost layer of each of the semiconductor devices A', B', a plurality of pads 111 are formed together with power supply/ground wiring lines and wiring lines for supplying associated control signals to a memory cell unit and a control circuit. In this case, as shown in FIGS. 4A, 5A, function blocks of a memory cell unit and a control circuit are disposed in the center of the device and the plurality of pads 111 are disposed at the periphery of the device in terms of designing. As described above, in order to form the pads, it has been conventionally necessary for the device to have an additional peripheral region at the periphery of a region that contains wiring lines for supplying associated control signals to each of the control circuits and the like.

In contrast, in the semiconductor device of the embodiment, an uppermost layer as a dedicated layer for pads is formed above a layer in which power supply/ground wiring lines and wiring lines for supplying associated control signals to a memory cell unit and a control circuit are formed, and then, a plurality of pads 11 and the like are formed in the uppermost layer. Accordingly, the plurality of pads 11 can be formed in the uppermost layer to correspond to the location of function blocks of the memory cell unit and the control circuit, eliminating the need for a peripheral region for formation of pads, which region has been required in the conventional semiconductor device. In effect, as can be seen from the comparison between FIGS. 1 and 4A and between FIGS. 2 and 5A, the semiconductor devices A, B each have no peripheral region for formation of pads provided therein, which region has been required in the conventional semiconductor device. Therefore, the semiconductor device of the embodiment is able to reduce in size the area covered by the peripheral region for formation of pads. This allows the invented semiconductor device to increase the number of chips on a wafer.

On the other hand, the plurality of pads 111 employed in the conventional semiconductor devices A', B' each are formed in accordance with the layout that varies depending on the type of product. Accordingly, for example, when measuring the electrical characteristics of a semiconductor device to inspect the device by using a probe card, it has been necessary to use a dedicated probe card with probe tips whose ends are suitably arranged for one-to-one contact with the pads 111 and designed in accordance with the layout of the pads 111 of the corresponding semiconductor device. For example, since the semiconductor device A' and the semiconductor device B' each have the pads 111 arranged according to different layouts, probe cards with probe tips 121 that are arranged according to different layouts are used accordingly to inspect the corresponding devices, as shown respectively in FIGS. 4B and 5B.

Furthermore, when connecting each of the pads 111 to the corresponding lead terminal of the lead frame, the use of the lead terminals 131 that are suitably arranged for one-to-one correspondence with the pads 111 of the semiconductor device has been required, as shown in FIGS. 4C and 5C. Accordingly, as shown in. FIGS. 4D and 5D, process conditions for wire bonding also vary depending on the type of product. As described above, every time when a new type of product is developed, it has conventionally been required to newly design the layout of probe tips on a probe card and the pattern of lead terminals of a lead frame to meet the geometric configuration of the product.

In the embodiment, since the layout of the pads 11 is made common regardless of the type of product, the electrical characteristics of the semiconductor device A, B, which are products of different types, can be measured to inspect the corresponding device by using a probe card with probe tips 41 arranged according to the same layout, as shown in FIG. 3A. In addition, as shown in FIG. 3B, the lead frame with lead terminals 51 and the like that are designed according to the same design specification can be used to connect to the plurality of pads of the semiconductor devices A, B. Moreover, as shown in FIG. 3C, wire bonding can be performed under the same process conditions for wire bonding.

It should be noted that in the embodiment, although the layout of pads 11 is made common regardless of the type of product, it is desirable to determine how the pads 11 should be disposed in the semiconductor device in terms of, for example, ease of operation for bringing probe tips on a probe card into contact with the pads, ease of operation for performing wire bonding, and the like. Although the plurality of pads 11 that are closely disposed in relation to each other in two columns are exemplified in FIGS. 1A, 2A, the pads 11 may, for example, be disposed apart a little bit distance from one another. Furthermore, the location of a set of the plurality of pads 11 can optionally be determined. For example, the pads 11 may be disposed at the periphery of the corresponding semiconductor device.

A method of manufacturing the semiconductor device constructed in accordance with the embodiment of the present invention will be explained below.

First, operation for designing a semiconductor device to be manufactured is performed. In more detail, the function to be performed by the semiconductor device is divided into appropriate blocks, each implementing the corresponding sub-function, and then, operations for designing a function to be implemented by the block, designing a circuitry to implement the corresponding function of the block, determining where components constituting the block are to be disposed in the block, and determining how the pattern of the components is to be formed in the block are performed with respect to each of the blocks. In this case, when designing the semiconductor device of the embodiment, the above-described operations can be performed taking into account the fact that the pads need not be disposed at the peripheries of those blocks. Thereafter, a mask pattern is produced based on how the pattern of the components is to be formed in each of the blocks.

Subsequently, process steps in the processing of a wafer (front-end steps) are performed. In the front-end steps, first, steps of isolating regions of semiconductor substrate from one another, forming elements in each of the regions thus isolated, forming wiring lines to connect the elements to each other and the like are performed. In the step of forming wiring lines in the embodiment, after forming wiring lines as a wiring layer to connect the elements to each other in accordance with the same method as that performed in the conventional technique, an uppermost layer as a dedicated layer for pads are formed above the wiring layer. Then, the uppermost layer comprised only of a plurality of pads 11, a plurality of contact holes 12 and uppermost wiring lines 13 for connecting the pads 11 to the corresponding contact holes 12 are formed. In this case, the layout of the pads 11 is made common regardless of the type of product.

Thereafter, the wafer thus formed is inspected. In more detail, the electrical characteristics of each semiconductor device are measured using a probe card to inspect the device. In this step, since the layout of the pads 11 is made common regardless of the type of product, a probe card with probe tips that are standardized can be used. Thus, the front-end steps are completed.

Subsequently, assembly steps of assembling a semiconductor device (rear-end steps) are performed. First, the wafer thus manufactured is divided into individual semiconductor devices. Then, each of the semiconductor devices is mounted in place on a lead frame and the pads 11 of the each of the semiconductor devices are connected to the lead terminals of the lead frame via bonding wires. In this step, since the layout of the pads 11 is made common regardless of the type of product, a lead frame whose design specification is made common regardless of the type of product can be used. In addition, wire bonding can be carried out while making process conditions for wire bonding common regardless of the type of product. Finally, the semiconductor device is sealed with, for example, a resin, thereby forming a finished product.

The semiconductor device of the embodiment includes an uppermost layer comprised only of a plurality of pads as an electrode for providing electrical connection with an external connection line for transmitting a signal to and from the semiconductor device, a plurality of contact holes for providing electrical connection with lower wiring lines formed in a lower layer below the uppermost layer, and uppermost wiring lines for connecting the pads to the corresponding contact holes. The semiconductor device thus configured is able to reduce in size the area covered by a peripheral region for forming the pads needed in the conventional semiconductor device, thereby increasing the number of chips on a wafer.

Furthermore, making the layout of pads common regardless of the type of product allows the use of a probe card with probe tips arranged according to the layout that is made common regardless of the type of product. In addition, a lead frame whose design specification is made common regardless of the type of product can be used, and process conditions for wire bonding are made common regardless of the type of product when wire bonding can be carried out. Accordingly, the semiconductor device constructed as described above is able to contribute to the suppression of increase in cost of manufacturing the device.

It should be appreciated that the present invention is not limited to the above-described embodiment and therefore, various modifications and improvements can be made to and in the above-described embodiment without departing from the spirit and scope of the objects of the present invention.

As described so far, according to the semiconductor device of the present invention, the semiconductor device includes an uppermost layer comprised only of a plurality of pads as an electrode for providing electrical connection with an external connection line for transmitting a signal to and from the semiconductor device, a plurality of contact holes for providing electrical connection with lower wiring lines formed in a lower layer below the uppermost layer, and uppermost wiring lines for connecting the pads to the corresponding contact holes. The semiconductor device thus configured is able to reduce in size the area covered by a peripheral region for forming the pads needed in the conventional semiconductor device, thereby increasing the number of chips on a wafer. Furthermore, making the layout of pads common regardless of the type of product allows the use of a probe card with probe tips arranged in accordance with the layout that is made common regardless of the type of product. In addition, a lead frame whose design specification is made common regardless of the type of product can be used, and process conditions for wire bonding are made common regardless of the type of product when wire bonding can be carried out.

Additionally, according to the method of manufacturing a semiconductor device constructed in accordance with of the present invention, the semiconductor device is able to reduce in size the area covered by a peripheral region for forming the pads needed in the conventional semiconductor device, thereby increasing the number of chips on a wafer. Furthermore, making the layout of pads common regardless of the type of product allows the use of a probe card with probe tips arranged in accordance with the layout that is made common regardless of the type of product. In addition, a lead frame whose design specification is made common regardless of the type of product can be used, and process conditions for wire bonding are made common regardless of the type of product when wire bonding can be carried out.

What is claimed is:

1. A semiconductor device comprising:
   an uppermost layer of a die on a semiconductor wafer comprised only of:
   a plurality of pads as an electrode for providing electrical connection with an external connection line for transmitting a signal to and from said semiconductor device, wherein at least one of the pads is wire-bonded to the external line connection;
   a plurality of contact holes for providing electrical connection with lower wiring lines formed in a lower layer below said uppermost layer; and
   uppermost wiring lines for connecting said plurality of pads to said plurality of contact holes correspondingly;
   wherein a layout of said plurality of pads is common among a plurality of separate dies on the semiconductor wafer.

2. The semiconductor device according to claim 1, wherein the layout of said plurality of pads is independent of the composition or structure of layers in the semiconductor device that are below the uppermost layer.

3. The semiconductor device according to claim 1, wherein a layout of said plurality of pads is common among dies formed on different semiconductor wafers.

4. The semiconductor device according to claim 1, wherein the external line connection is at least one lead terminal of a lead frame, and at least one wire bonded pad is wire-bonded to one of the at least one lead terminals.

5. A semiconductor device comprising:
   an uppermost layer of a semiconductor die comprised only of:
   a plurality of pads as an electrode for providing electrical connection with an external connection line for transmitting a signal to and from said semiconductor device, wherein at least one of the pads is wire-bonded to the external line connection;
   a plurality of contact holes for providing electrical connection with lower wiring lines formed in a lower layer below said uppermost layer; and
   uppermost wiring lines for connecting said plurality of pads to said plurality of contact holes correspondingly;
   wherein a layout of said plurality of pads is common among a plurality of separate dies on the semiconductor wafer.

6. The semiconductor device according to claim 5, wherein a layout of said plurality of pads is common among dies formed on different semiconductor wafers.

7. The semiconductor device according to claim 5, wherein the layout of said plurality of pads is independent of the composition or structure of layers in the semiconductor device that are below the uppermost layer.

8. The semiconductor device according to claim 5, wherein the external line connection is at least one lead terminal of a lead frame, and at least one wire bonded pad is wire-bonded to one of the at least one lead terminals.

9. A semiconductor device comprising:
   an uppermost layer of a die on a semiconductor wafer consisting essentially of:
   a plurality of pads as an electrode for providing electrical connection with an external connection line for transmitting a signal to and from said semiconductor device, wherein at least one of the pads is wire-bonded to the external line connection;
   a plurality of contact holes for providing electrical connection with lower wiring lines formed in a lower layer below said uppermost layer;
   uppermost wiring lines for connecting said plurality of pads to said plurality of contact holes correspondingly;
   wherein a layout of said plurality of pads is common among a plurality of separate dies on the semiconductor wafer; and
   an uppermost layer structural material for supporting the pads, contact holes, and wiring lines.

10. The semiconductor device according to claim 9, wherein a layout of said plurality of pads is common among dies formed on different semiconductor wafers.

11. The semiconductor device according to claim 9, wherein the layout of said plurality of pads is independent of the composition or structure of layers in the semiconductor device that are below the uppermost layer.

12. The semiconductor device according to claim 9, wherein the external line connection is at least one lead terminal of a lead frame, and at least one wire bonded pad is wire-bonded to one of the at least one lead terminals.

13. A semiconductor device comprising:
   an uppermost layer of a semiconductor die comprised only of:
   a plurality of pads as an electrode for providing electrical connection with an external connection line for transmitting a signal to and from said semiconductor device, wherein at least one of the pads is wire-bonded to the external line connection;
   a plurality of contact holes for providing electrical connection with lower wiring lines formed in a lower layer below said uppermost layer;
   uppermost wiring lines for connecting said plurality of pads to said plurality of contact holes correspondingly;
   wherein a layout of said plurality of pads is common among a plurality of separate dies on the semiconductor wafer; and an uppermost layer structural material for supporting the pads, contact holes, and wiring lines.

14. The semiconductor device according to claim 13, wherein a layout of said plurality of pads is common among dies formed on different semiconductor wafers.

15. The semiconductor device according to claim 13, wherein the layout of said plurality of pads is independent of the composition or structure of layers in the semiconductor device that are below the uppermost layer.

16. The semiconductor device according to claim 13, wherein the external line connection is at least one lead terminal of a lead frame, and at least one wire bonded pad is wire-bonded to one of the at least one lead terminals.

\* \* \* \* \*